United States Patent [19]
Saito

[11] Patent Number: 5,914,592
[45] Date of Patent: Jun. 22, 1999

[54] SAMPLING SIGNAL GENERATING CIRCUIT FOR SAMPLING APPARATUS AND DIGITAL OSCILLOSCOPE

[75] Inventor: Masanori Saito, Tokyo, Japan

[73] Assignee: Hitachi Denshi Kabushiki Kaisha, Tokyo, Japan

[21] Appl. No.: 08/597,407

[22] Filed: Feb. 8, 1996

[30] Foreign Application Priority Data

Feb. 10, 1995 [JP] Japan ................................... 7-022603

[51] Int. Cl.$^6$ ................................................. G01R 13/34
[52] U.S. Cl. ........................................ 324/121 R; 702/67
[58] Field of Search ....................... 324/121 R; 364/487; 702/66, 67, 69, 70

[56] References Cited

U.S. PATENT DOCUMENTS 5,162,723 11/1992 Marzalek et al. .................. 324/121 R Primary Examiner—Ernest F. Karlsen
Attorney, Agent, or Firm—Antonelli, Terry, Stout & Kraus, LLP

[57] ABSTRACT

A signal from an original oscillation circuit is inputted into a phase-locked loop circuit capable of continuously varying a frequency of this signal derived from the original oscillation circuit. The phase-locked loop circuit changes the frequency of the signal derived from the original oscillation circuit into another frequency corresponding to sweep rate variable information derived from a sampling control unit, and then outputs the signal having the changed frequency. This signal outputted from the phase-locked loop circuit is supplied to a variable frequency dividing circuit. This variable frequency dividing circuit frequency-divides the frequency of the signal outputted from the phase-locked loop circuit at an arbitrary frequency dividing ratio corresponding to the sweep rate range information given from the sampling control unit, and thereafter outputs the signal with the frequency-divided frequency as a sampling signal.

12 Claims, 10 Drawing Sheets

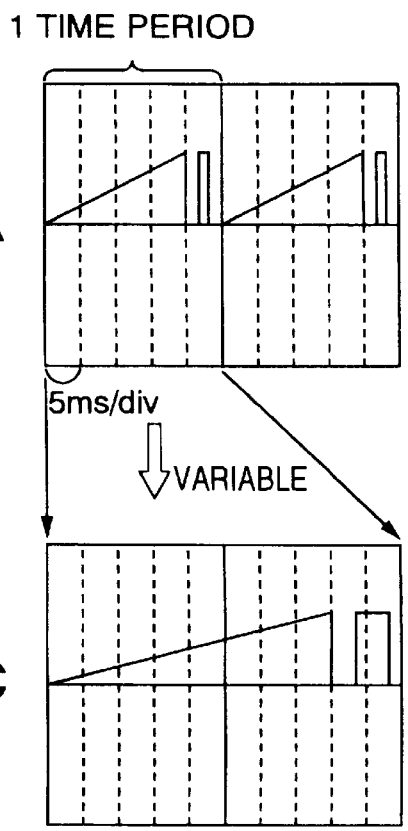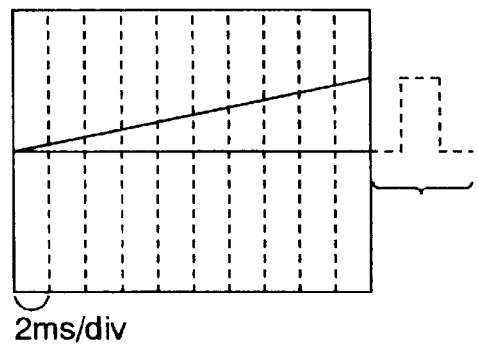

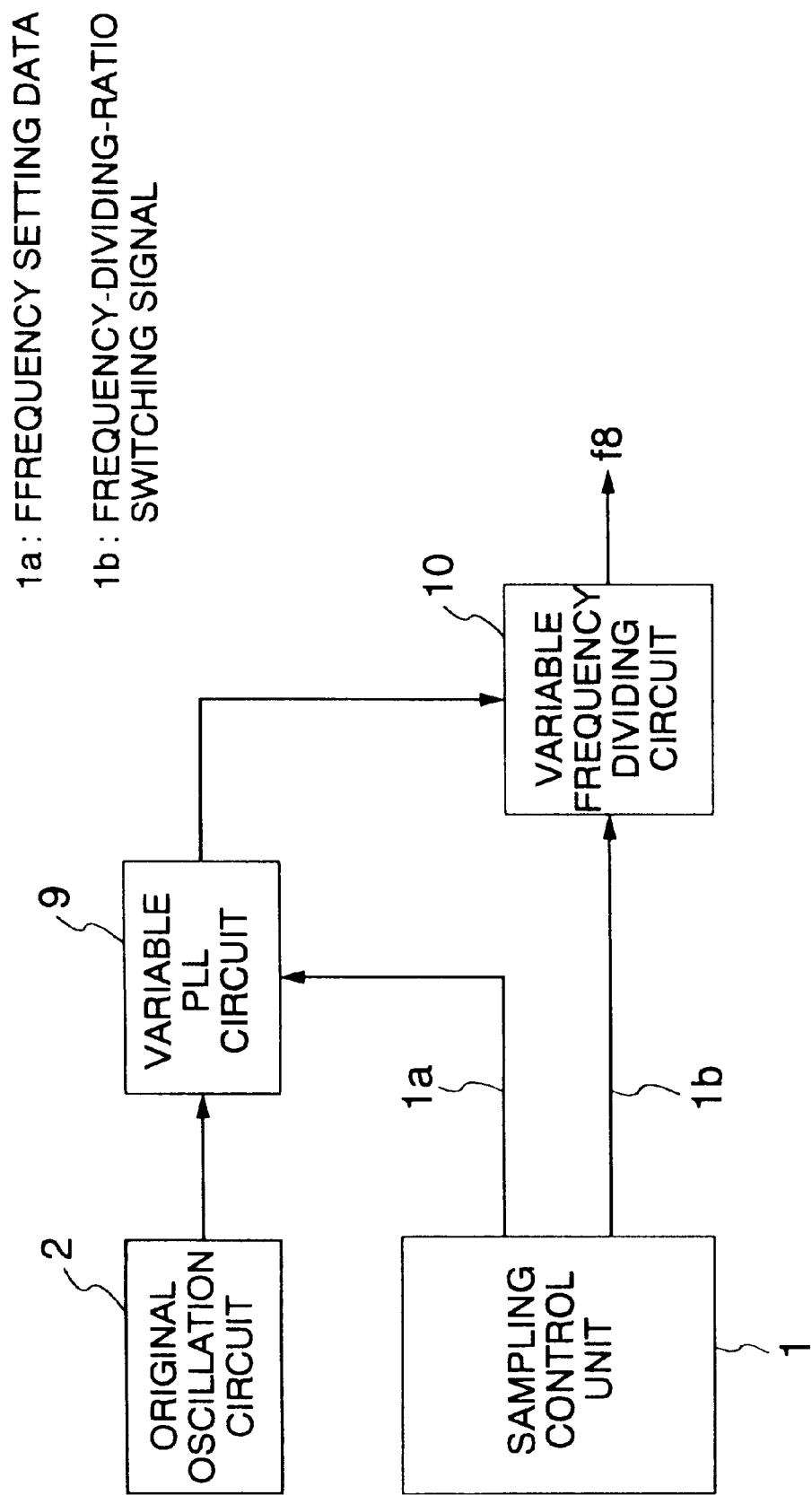

SAMPLING SIGNAL GENERATING CIRCUIT FOR SAMPLING APPARATUS AND DIGITAL OSCILLOSCOPE

BACKGROUND OF THE INVENTION

The present invention relates to a sampling signal generating circuit employed in such a sampling apparatus as a digital oscilloscope, a sampling digitizer, and an FFT analyzer, for converting a signal to be measured into a digital signal and for sampling this digital signal. The present invention also relates to a digital oscilloscope with employment of the sampling signal generating circuit.

Conventionally, in the above-described sampling apparatus, the frequency of the sampling operation is produced by the frequency dividing circuit from the original oscillating frequency of the oscillator circuit. In FIG. 1, there is shown one typical circuit arrangement of the prior art sampling apparatus.

In this sampling apparatus, reference numeral 2 indicates an original oscillation circuit, reference numeral 12 shows a control unit, reference numeral 14 denotes a sampling timing control unit, and reference numeral 15 shows an input terminal. Also, reference numeral 16 represents an amplifier, reference numeral 17 is an analog-to-digital (A/D) converter, reference numeral 18 shows an acquisition memory, reference numeral 101 indicates a 1/m frequency dividing circuit, reference numeral 102 represents a 1/n frequency dividing circuit, reference numeral 103 denotes a 1/p frequency dividing circuit, and reference numeral 24 is a switching circuit.

It should be noted that symbols m, n, p indicate integers, respectively.

The waveform data outputted from the acquisition memory 18 is supplied via a display memory (not shown) to a display circuit (not shown either), and thus the waveform thereof is displayed on a screen of a display device (not shown either).

The signal entered from the input terminal 15 is A/D-converted digital signal is acquired by the acquisition memory 18. The timing of this A/D conversion and the data acquisition timing of the acquisition memory 18 are determined based upon the frequency of the sampling signal entered into the sampling timing control unit 14.

The signal having the frequency "$f_0$" outputted from the original oscillator circuit 2 is sequentially divided by way of the 1/m frequency dividing circuit 101, the 1/n frequency dividing circuit 102, - - - , 1/p frequency dividing circuit 103. In this case, the output frequency of the 1/m frequency dividing circuit 101 is equal to $f_o/m$, the output frequency of the 1/n frequency dividing circuit 102 is equal to $f_0/(m \times n)$, and also the output frequency of the 1/p frequency dividing circuit 103 is equal to $f_0/(m \times n \times - - - \times p)$.

These frequency-divided signals are inputted into the switching circuit 24. In response to the control signal derived from the control unit 12, the switching circuit 24 switches which frequency-divided signal should be used as the sampling frequency $f_s$. Assuming now that symbols m, n, - - - , p are selected to be positive integers, the resultant sampling frequency "$f_s$" is merely selected only from such values, namely 1/positive integers of the original oscillation frequency "$f_0$".

On the other hand, in digital oscilloscopes, sampling rates are normally determined in accordance with sweep rates or speeds (time ranges). The time range is of the step type. Therefore, since intermedium values cannot be set, there are certain difficulties of waveform observation, depending upon various situations of signal frequencies and signal periods. As represented in a display sample of a waveform under observation of FIG. 2A, for instance, in the case that one time period of a waveform under observation by 5 msec/div. is wanted to be displayed over the entire display screen (namely, enlarged representation), the sweep rate is changed. However, since the conventional sweep rate is of the step type and the sweep rate subsequent to the present sweep rate (5 msec/div) is set to, for example, 2 msec/div, the above-described waveform would be displayed as the waveform shown in FIG. 2B. As a consequence, a portion of this waveform shown in FIG. 2B would be dropped, and thus one complete period of this resulting waveform could not be displayed.

SUMMARY OF THE INVENTION

Since the frequency dividing ratios by the above-explained conventional frequency dividing circuits 101 to 103 are only selected from 1/positive integers, only discrete values are merely set as the sampling frequencies, and the sampling frequency cannot be continuously varied. That is, there is a drawback in the conventional sampling signal generating circuit such that when the original oscillation frequency "$f_0$" is equal to 10 MHz, it is possible to produce the frequencies of $f_0/2$ (=5 MHz), $f_0/3$ (=3.33 MHz), $f_0/4$ (=2.5 MHz). However, other frequencies of 8 MHz, 7 MHz, 4 MHz cannot be obtained.

Accordingly, in the above-described conventional digital oscilloscope, since the sweep rate or speed is merely variable in the step mode, it is not possible to set the optimum sweep rate with respect to an arbitrary waveform. Accordingly, this arbitrary waveform may be difficulty observed.

An object of the present invention is to solve the above-described problems, and therefore, is to provide a sampling signal generating circuit capable of continuously varying a sampling frequency, and also to provide a digital oscilloscope with employment of such a sampling signal generating circuit with a variable sampling frequency.

A sampling signal generating circuit, according to a basic aspect of the present invention, is comprised of: an original oscillation circuit for oscillating a signal having a predetermined frequency; a sampling control unit for outputting control information; and a variable phase-locked loop circuit capable of continuously varying the frequency of the signal derived from said original oscillation circuit, and for outputting the signal having a predetermined frequency derived from said original oscillation circuit as a sampling signal used to change said predetermined frequency into a frequency corresponding to said control information.

A digital oscilloscope, according to one aspect of the present invention, is comprised of: an input circuit for converting an analog input signal under observation into a proper level; an analog-to-digital converter for sampling the analog signal outputted from said input circuit to be converted into a digital signal; an acquisition memory for storing therein the digital signal derived from said analog-to-digital converter; a display memory for storing therein the digital signal transferred from said acquisition memory; a display device for reading out the digital signal stored in said display memory so as to be displayed as a waveform; a sampling timing control unit for controlling both of a timing at which said analog-to-digital converter samples said analog signal derived from said input circuit, and another timing at which said acquisition memory samples said digital signal derived from said digital-to-analog converter in response to a sampling signal; a setting unit for setting sweep rate range information used to continuously set a sweep rate range in said display device; and an oscilloscope control unit for controlling the frequency of said sampling signal generated from said sampling signal generating circuit in accordance with the sweep rate range information set by said setting means, and also for controlling that said digital signal is transferred from said acquisition memory to said display memory; wherein: said sampling signal generating circuit includes: an original oscillation circuit for oscillating a signal having a predetermined frequency; and a phase-locked loop circuit for continuously varying the frequency of the signal derived from said original oscillation circuit.

Alternatively, such a frequency dividing circuit for frequency-dividing the output frequency of this phase-locked loop circuit based on an arbitrary frequency dividing ratio may be additionally provided with the sampling signal generating circuit other than the phase-locked loop circuit.

Also, after the output frequency of the original oscillation circuit has been frequency-divided by an arbitrary frequency dividing ratio, the sampling signal generating circuit may supply this frequency-divided signal to the phase-locked loop circuit.

That is, when the above-explained sampling signal generating circuit is applied to a digital oscilloscope, the sweep rate range information functioning as the control information is properly set. As a result, the waveform displayed on the display screen of the display device can be enlarged/compressed in an arbitrary size. Therefore, a waveform having an arbitrary frequency can be displayed on the entire display screen of the display device in an arbitrary time period.

In this case, when the scale on the display screen is similarly enlarged/compressed along the horizontal direction in the enlarging/compressing ratio of the waveform in accordance with the sweep rate range information, the temporal relationship between the waveform and the scale can be continuously maintained in one-to-one correspondence.

In accordance with another aspect of the present invention, a digital oscilloscope is comprised of: an input circuit for converting an analog input signal under observation into a proper level; an analog-to-digital converter for sampling the analog signal outputted from said input circuit to be converted into a digital signal; an acquisition memory for storing therein the digital signal derived from said analog-to-digital converter; a display memory for storing therein the digital signal transferred from said acquisition memory; a display device for reading out the digital signal stored in said display memory so as to be displayed as a waveform; a sampling timing control unit for controlling both of a timing at which said analog-to-digital converter samples said analog signal derived from said input circuit, and another timing at which said acquisition memory samples said digital signal derived from said digital-to-analog converter in response to a sampling signal; a setting unit for setting first sweep rate range information used to continuously set a sweep rate range in said display device and second sweep rate range information used to set said sweep rate range in a step mode; and second sweep rate range information used to set said sweep rate range in a step mode; and an oscilloscope control unit for controlling the frequency of said sampling signal generated from said sampling signal generating circuit in accordance with the first and second sweep rate range information set by said setting means, and also for controlling that said digital signal is transferred from said acquisition memory to said display memory; wherein: said sampling signal generating circuit includes: a variable phase-locked loop circuit capable of continuously varying the frequency of the signal derived from said original oscillation circuit, and for changing the signal having a predetermined frequency derived from said original oscillation circuit into such a frequency in response to said first control information, thereby outputting the signal having the changed frequency; and a variable frequency dividing circuit for frequency-dividing the signal derived from said variable phase-locked loop circuit based on an arbitrary frequency dividing ratio in accordance with said second control information and for outputting the frequency-divided signal as a sampling signal.

In other words, when the above-explained sampling signal generating circuit is applied to a digital oscilloscope, the sweep rate range information and the sweep rate variable information functioning as the first and second control information are properly set. As a result, the waveform displayed on the display screen of the display device can be enlarged/compressed in an arbitrary size. Therefore, a waveform having an arbitrary frequency can be displayed on the entire display screen of the display device in an arbitrary time period.

In this case, when the scale on the display screen is similarly enlarged/compressed along the horizontal direction in the enlarging/compressing ratio of the waveform in accordance with the sweep rate range information and the sweep rate variable information, the temporal relationship between the waveform and the scale can be continuously maintained in one-to-one correspondence.

BRIEF DESCRIPTION OF THE DRAWINGS

A more complete understanding of the present invention may be gained by reading the subsequent detailed description with reference to the drawings, in which:

FIG. 2A and FIG. 2B are explanatory diagrams for explaining display examples of waveform data by the conventional sampling signal generating circuit for the sampling apparatus, shown in FIG. 1;

FIG. 2C is an explanatory diagram for explaining a display example of waveform data by a sampling signal generating circuit according to the present invention;

FIG. 3 is a schematic block diagram for representing a sampling signal generating circuit according to an embodiment of the present invention;

DESCRIPTION OF THE PREFERRED EMBODIMENTS

Figure 1:
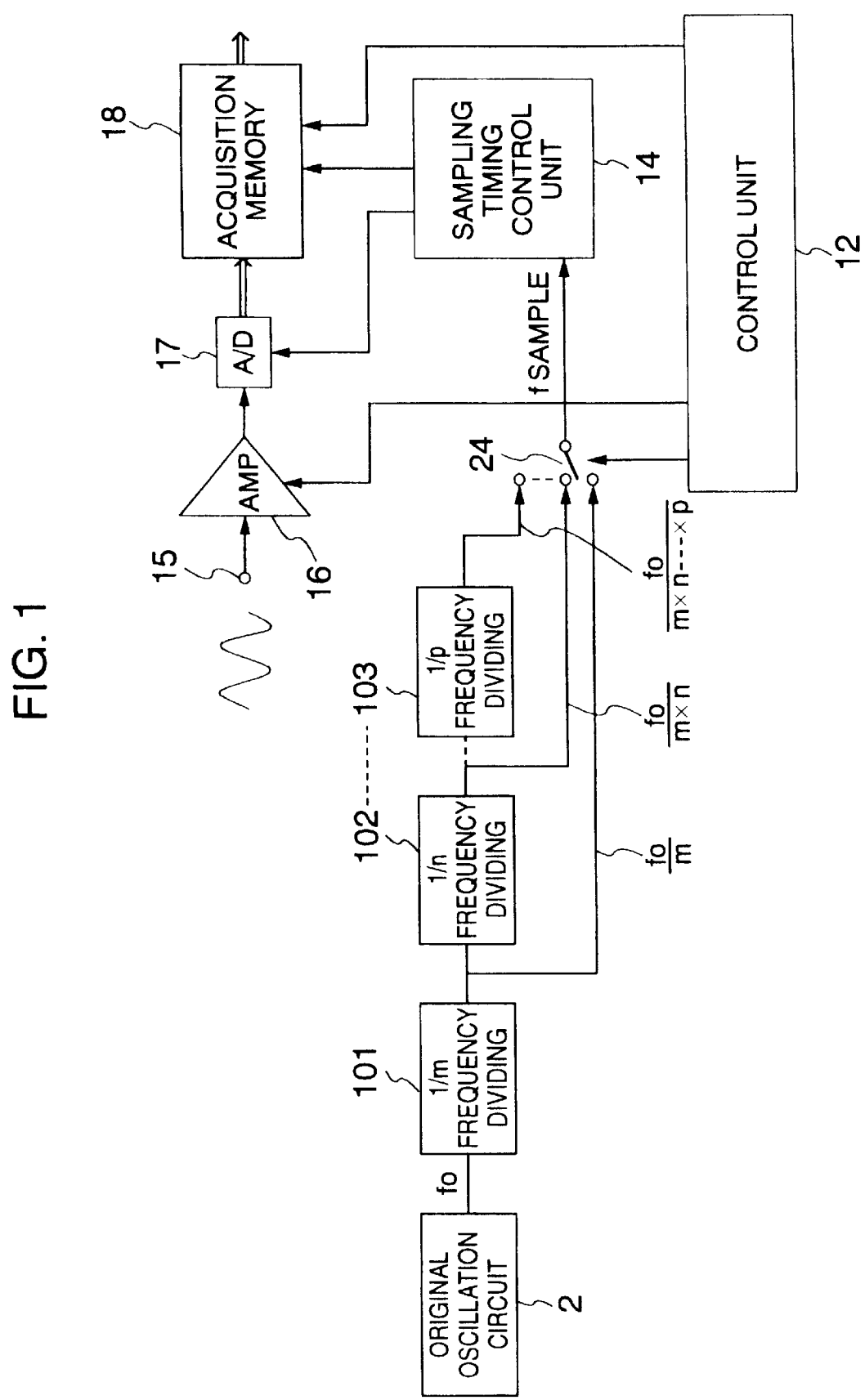
FIG. 1 is a schematic block diagram for showing one structural example of the conventional sampling signal generating circuit for the sampling apparatus.

Referring now to the accompanying drawings, a sampling signal generating circuits for a sampling apparatus, according to embodiments of the present invention, will be described.

FIG. 3 is a schematic block diagram for representing a sampling signal generating circuit according to an embodiment of the present invention.

In this drawing, reference numeral 1 shows a sampling control unit, reference numeral 1a indicates frequency setting data, reference numeral 1b represents a frequency-dividing-ratio switching signal, reference numeral 2 denotes an original oscillation circuit, reference numeral 9 indicates a variable PLL circuit, reference numeral 10 represents a variable frequency dividing circuit, and symbol "$f_s$" is such an output signal continuously variable in accordance with the present invention.

Figure 4:
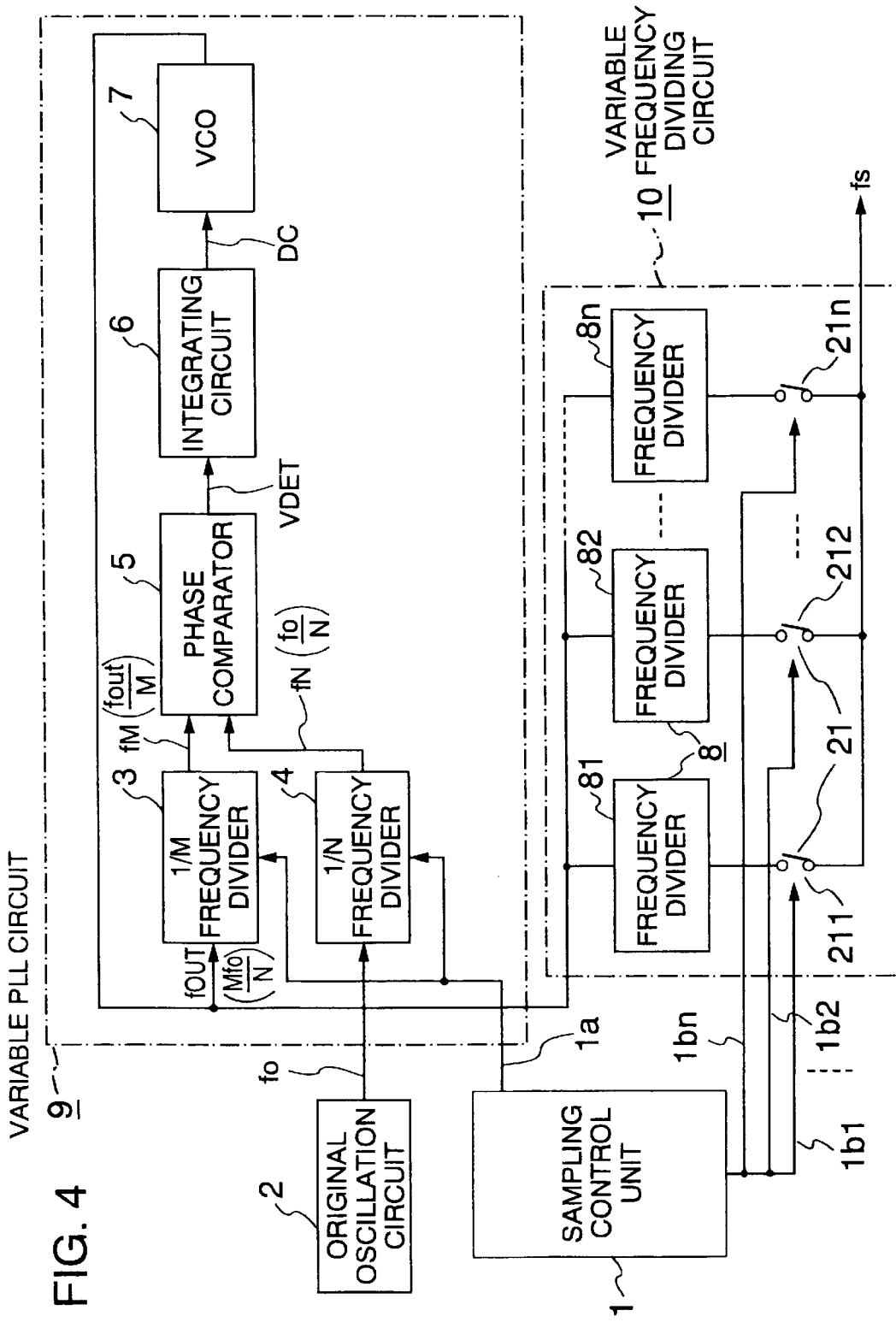
FIG. 4 is a block diagram for indicating a concrete circuit arrangement of the sampling signal generating circuit shown in FIG. 3.

FIG. 4 is another block diagram for representing a concrete circuit arrangement of the sampling signal generating circuit shown in FIG. 3. That is, in FIG. 4, both of the variable PLL circuit 9 and the variable frequency dividing circuit 10 shown in FIG. 3 are represented by way of a more concrete circuit arrangement.

The sampling signal generating circuit according to one embodiment of the present invention will now be described with reference to FIG. 4.

Reference numeral 1 indicates a sampling control circuit for controlling a sampling rate. This sampling control circuit 1 outputs the frequency setting data 1a used to continuously change the sampling frequency, and the frequency-dividing-ratio switching signal 1b used to change the sampling frequency in a stepwise mode.

In the case that the sampling frequency is varied in a plurality of steps, for instance, "n" (namely, "n" being a plurality of integers), a plurality of frequency-dividing-ratio switching signals 1b (for instance, 1b1, 1b2, - - - , 1bn) are similarly provided.

The frequency-dividing-ratio switching signal 1b corresponds to sweep rate (time range) information (namely, first sweep rate information).

This first sweep rate information corresponds to, for instance, such setting information used to switch the time range of 1 msec/div. into a plurality of steps, e.g., 21 steps in the step manner in a digital oscilloscope to which the sampling signal generating circuit of this embodiment is applied. The frequency setting data 1a corresponds to sweep rate variable information (second time range information) used to continuously change, for example, a time range (sweep rate). Both of the former and latter information will constitute such information for indicating how to display a signal waveform on a screen in a compression mode.

It should be understood that according to the major feature of the present invention, the sweep rate or speed (time range) is continuously variable, and therefore, a sweep rate setting means must not be necessarily divided into two setting means, i.e., a step type sweep rate setting means and a variable type sweep rate setting means.

In the case of a digital oscilloscope, when sweep rate information indicates a high sweep range, a high sampling frequency "$f_s$", for example, 100 MHz is necessarily required. On the other hand, when sweep rate variable information is, for instance, ⅔ (namely, a waveform is displayed on a screen in a compression mode of ⅔ along a time range direction with respect to the normal mode), the sampling frequency "$f_s$" is equal to ⅔ of the frequency in the set sweep rate information. Reference numeral 2 shows an original oscillation circuit which outputs a basic signal having a frequency "$f_0$". The oscillation frequency of this original oscillation circuit may be produced within an apparatus using the sampling signal generating circuit of the present invention, or may be produced by employing an externally entered frequency, namely this oscillation frequency may function as the basic frequency. A 1/N frequency divider 4 and a 1/M frequency divider 3 are such circuits for dividing frequencies entered therein by 1/N and 1/M, respectively. Symbols "N" and "M" are selected to be positive integers as optimum numbers, and there is no limitation in a large/small relationship between N and M. These output frequencies are indicated by "fM" and "fN", respectively. Reference numeral 5 is a phase comparator which detects a phase difference between two input signals and outputs a signal "$V_{DET}$" indicative of this phase difference. Reference numeral 6 is an integrating circuit for converting the signal $V_{DET}$ into a DC signal "DC". Reference numeral 7 indicates a voltage-controlled oscillator (VCO) which outputs a frequency "$F_{OUT}$" corresponding to the input voltage DC.

Reference numeral 10 indicates a variable frequency dividing circuit including a plurality of frequency dividers 8 and a plurality of selecting switches 21. As described above, when the sampling frequency is changed into a plurality of steps or stages (for instance, "n" steps), "n" pieces of frequency dividers 8 (81, 82, - - - , 8n) are employed and similarly, "n" pieces of selecting switches 21 (211, 212, - - - 21n). Accordingly, "n" sorts of frequency-dividing-ratio switching signals 1b are employed. It should be understood that although n pieces of frequency dividers 8 are provided in the above-explained embodiment, a single variable frequency dividers may be alternatively employed and the frequency dividing ratio of this single variable frequency divider may be controlled in response to the frequency dividing ratio defined by the frequency-dividing-ratio switching signal 1b.

A description of the variable PLL circuit employed in the sampling signal generating circuit of FIG. 4 will now be made.

The frequency setting data 1a derived from the sampling control unit sets the frequency dividing ratios 1/N and 1/M of the 1/N frequency divider 4 and the 1/M frequency divider 3, respectively. The frequencies fM and fN divided by these frequency dividers 3 and 4 become fM=fOUT/M and fN=$f_0$/N, respectively.

The signals having the frequencies fM and fN are inputted into the phase comparator 5. In this phase comparator 5, a signal $V_{DET}$ having a pulse width corresponding to the phase difference between the frequencies fM and fN. Then, this signal $V_{DET}$ is converted into a DC voltage by the integrating circuit 6. In response to this voltage change, the output frequency $F_{OUT}$ from the voltage-controlled oscillator 7 is varied. This signal having the frequency $F_{OUT}$ is again entered into the 1/M frequency divider 3, so that this frequency $F_{OUT}$ is phase-locked at a frequency of $f_0 \times M/N$.

It should be noted that the values of N and M are determined by the frequency setting data 1a, and the higher the resolution of N and M become, the better the continuities become. It should also be noted that since these setting data and the like are digitally processed in this embodiment, strictly speaking, a perfect continuity cannot be realized. Alternatively, if these setting data are processed in the analog manner, then a continuous variation of these values M and N may be perfectly achieved. However, when the frequency dividing steps are increased, the response would be delayed. Furthermore, generally speaking, since the phase comparator 5, the integrating circuit 6, and the voltage-controlled oscillator 7 cannot own such higher resolution, it is rather difficult to vary the frequency over a wide range.

That is, assuming now that, for example, the output signal frequency "$f_0$" of the original oscillation circuit 2 is fixed to 10 MHz under $f_{OUT}=f_0 \times M/N$, and the values of M and N are defined within a range of 1 to 32 (equal to 5 bits), this output signal frequency "$f_0$" may be equal to any one of $f_0 \times 1/32$, $f_0 \times 1/31$, $f_0 \times 1/30$, - - -, $f_0 \times 1/17$, $f_0 \times 1/16$ (=$f_0 \times 2/32$), $f_0 \times 2/31$, $f_0 \times 2/30$ (=$f_0 \times 1/15$), - - -, $f_0 \times 30/1$, $f_0 \times 31/1$, and $f_0 \times 32/1$.

At this time, it becomes $(f_0 \times 1/31)/(f_0 \times 1/32)=1.03$, and therefore, there is a non-continuous portion of about 3%. Assuming that M and N own values of 1 to 1,000 (equal to 10 bits), the output signal frequency $F_{OUT}$ is $f_0 \times 1/1000$, $f_0 \times 1/999$, $f_0 \times 1/998$, - - -, $f_0 \times 1000/1$, and then $(f_0 \times 1/999)/(f_0 \times 1/1000)=1.001$, namely approximately 0.1%. Thus, the better continuity can be achieved and at the same time, the wide variable range can be achieved. However, in such a case that a sweep rate range (time range) is very wide as in a digital oscilloscope, for instance, a variation range of a sweep rate is selected to be 5 $\mu$s/div. to 50 s/div., a maximum change ratio would become 1 to $10^7$, which cannot be sufficiently covered by the frequency range of the variable PLL circuit 9. In a certain case, the sampling frequency would become from 0.1 Hz to 100 MHz, namely very wide, which could not be sufficiently covered by the frequency range of this variable PLL circuit 9.

Under such a circumstance, in accordance with this embodiment, the relevant selecting switch 21 is operated based on the frequency-dividing-ratio switching signal 1b so as to switch the frequency divider 8, so that the frequency dividing ratio of the signal having the frequency $f_{OUT}$ is switched. As a consequence, as indicated in FIG. 5, it is possible to output such a sampling frequency "$f_s$" variable over a wide range.

Figure 5:
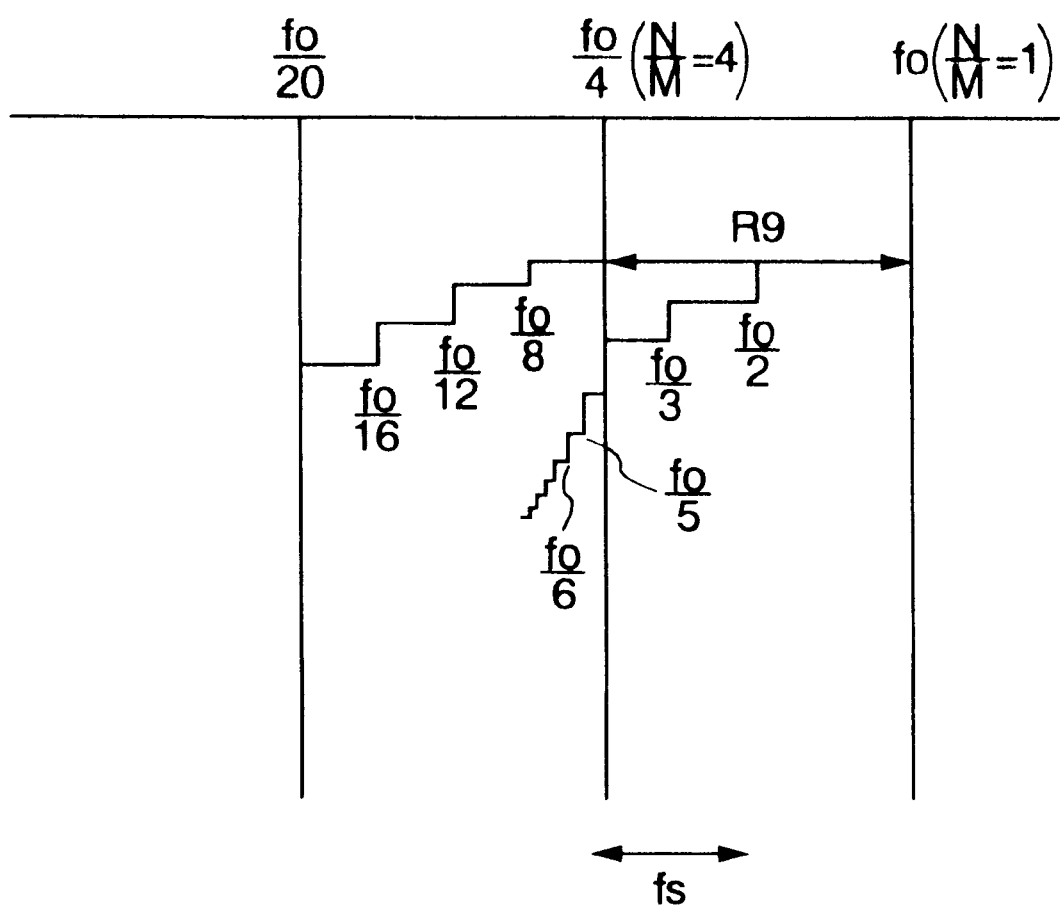
FIG. 5 is an explanatory diagram for explaining operation of the sampling signal generating circuit indicated in FIG. 4.

That is, FIG. 5 is an explanatory diagram for explaining the frequency variable operation by the sampling signal generating circuit shown in FIG. 4. In FIG. 5, symbol "R9" indicates an example of a continuous frequency variable range by the variable PLL circuit 9. In other words, assuming not that the frequency variable range of the variable PLL circuit 9 is selected to $f_0(N/M=1)$ to $f_0/4(N/M=4)$, the frequency can be continuously varied within this range R9 by way of the variable PLL circuit 9. Furthermore, for example, assuming now that four sets of frequency dividers 81 to 84 are employed in the variable frequency dividing circuit 10 and the frequency dividing ratios thereof are 1/2, 1/3, 1/4 and 1/5, in the case of N/M=1, the output frequency $f_0$ of the variable PLL circuit 9 is selectively frequency-divided into any one of these frequencies of $f_0/2$, $f_0/3$, $f_0/4$, $f_0/5$ in the variable frequency dividing circuit 10. In the case of N/M=4, the output frequency $f_0/4$ of the variable PLL circuit 9 is selectively frequency-divided into any one of these frequencies $f_0/8$, $f_0/12$, $f_0/16$, $f_0/20$ by the variable frequency dividing circuit 10.

As a result, the frequency may be continuously varied within the range of $f_0$ to $f_0/20$ in the variable PLL circuit 9 and the variable frequency dividing circuit 10.

Furthermore, the overall variable frequency range may be widened by widening the frequency variable range of the variable PLL circuit 9, namely, the ratio of N/M is selected to be larger than 4. Also, the frequency dividing ratio of the variable frequency dividing circuit 10 is further increased, so that the overall variable frequency range may be furthermore widened.

Moreover, when a total number of frequency dividers 8 is increased, the continuous frequency variable range may be further widened. It should be noted that as apparent from the foregoing description, the variable frequency range of FIG. 5 may constitute one exemplary embodiment.

It should also be noted that since the frequency divider 8 and the selecting switch 21 are merely one means to arbitrarily switch the frequency dividing ratio, these components may be substituted by any other means capable of realizing a plurality of frequency divisions.

Next, referring to FIG. 6, a description will be made of a digital oscilloscope as an embodiment, to which the sampling signal generating circuit according to the present invention has been applied. It should be noted that the same reference numerals shown in FIGS. 1, 3 and 4 will be employed as those for denoting the same or similar functions in FIG. 6, and explanations thereof are omitted.

In this drawing, a sampling signal generating circuit 13 corresponds to the circuits having the arrangements indicated in FIG. 3 and FIG. 4. An operation unit 11 is constructed of various sorts of switches used to perform various functions of the digital oscilloscope. The operation unit 11 can set sweep rate information and sweep rate variable information (namely, information used to further continuously vary sweep rate, or time range with respect to the set sweep rate). An oscilloscope control unit 50 owns such a function to control the sampling signal generating circuit 13 and the like in accordance with the sweep rate information and the sweep rate variable information set by the operation unit 11, other than the normal control function of the digital oscilloscope similar to the control unit 12 of FIG. 1.

A control unit 50 changes an amplification and an attenuation degree of an input circuit 16 in response to operations of the operation unit 11, and sends out data for varying the sampling frequency to the sampling control unit 1 based on the sweep rate information and the sweep rate variable information.

In this embodiment, the frequency-dividing-ratio switching data 1b of the above-described embodiment corresponds to the step type sweep rate information, and the frequency setting data 1a corresponds to the continuous sweep rate information.

A sampling frequency "$f_s$" produced in this arrangement is inputted to a sampling timing control unit 14 which will produces signals suitable for the A/D converting timing and the write timing of the acquisition memory.

It should be noted that although the sweep rate setting means of this embodiment is divided into the step type and the variable type, only a single sweep rate setting means may be alternatively employed because the gist of the present invention is to continuously change the sampling frequency. In this alternative case, it is obvious that the sweep rate setting range may contain a range varied in a step manner and another range changed in a variable manner (will be discussed later).

The operations of this digital oscilloscope other than the sampling operation are well known in the art. A waveform signal entered from the input terminal 15 passes through the input circuit 16 in order that a level of this signal is properly controlled. Then, the level-controlled signal is inputted into an A/D converter 17 so as to be converted into a corresponding digital signal in response to the sampling signal. The digital signal is then acquired by an acquisition memory 18.

It should be understood that the frequency to be A/D converted in this case corresponds to such a frequency continuously varied in response to the sampling frequency "$f_s$" as previously explained with respect to FIG. 4. Under control of the control unit 50, the digital signal acquired by the acquisition memory 18 is transferred to a display memory 19 and then is displayed in a display device 20.

Subsequently, operations of the operation unit 11, the oscilloscope control unit 50, and the sampling control unit 1 employed in the digital oscilloscope according to this embodiment will now be explained with reference to flow charts shown in FIG. 7 and FIG. 8.

Figure 7:
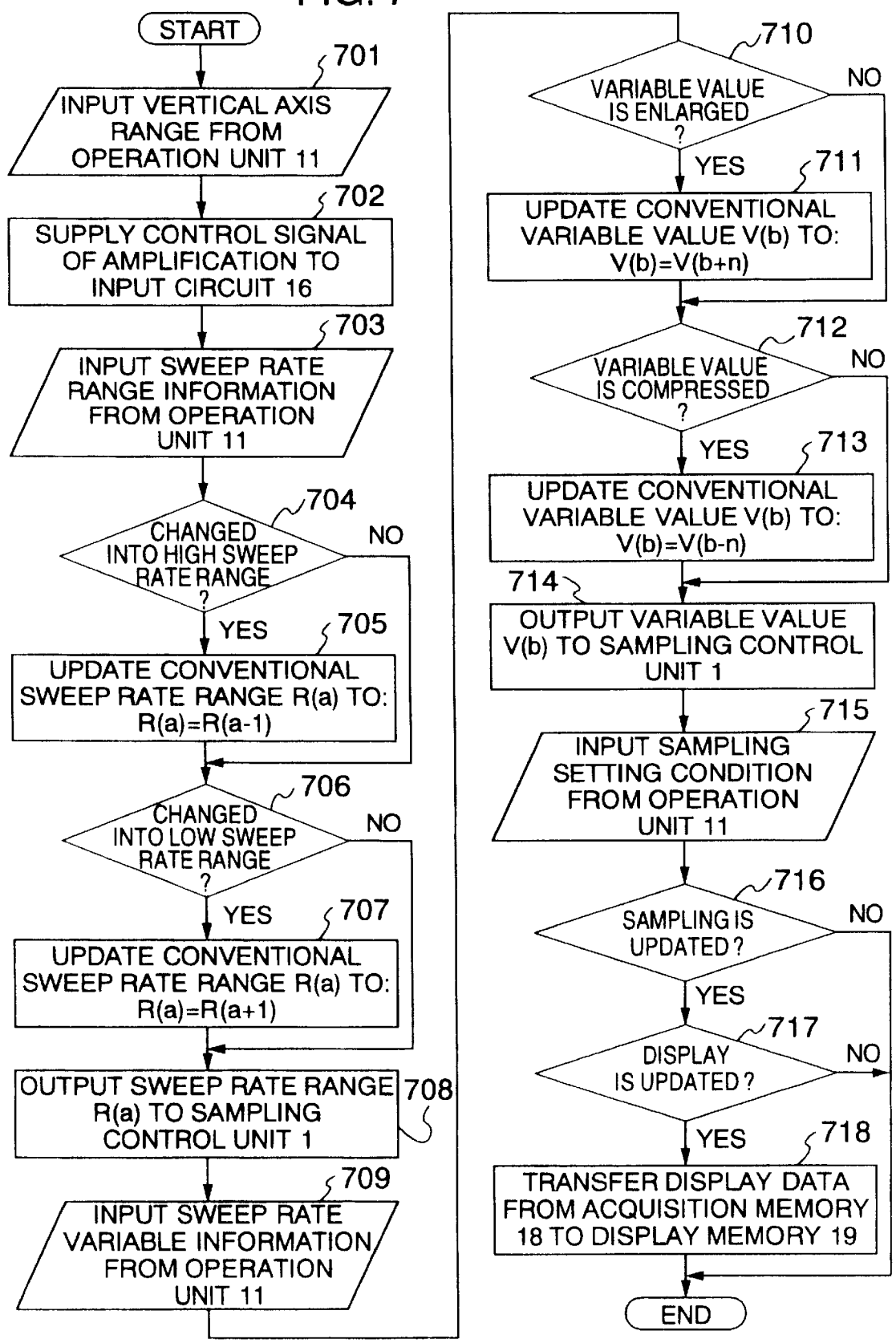
FIG. 7 is a flow chart for describing operations of the oscilloscope control unit shown in FIG. 6.
Figure 8:
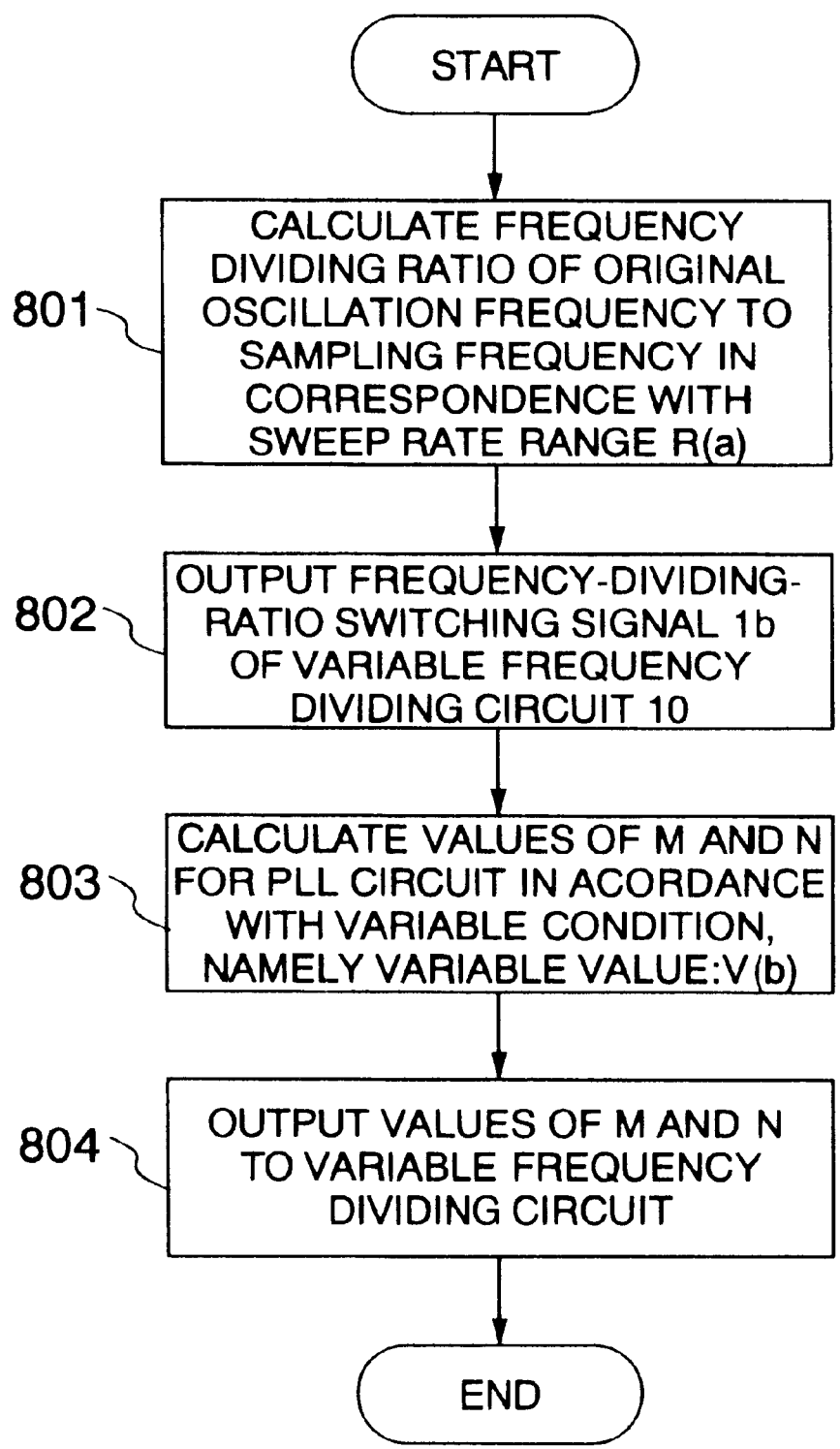
FIG. 8 is a flow chart for describing operations of the sampling control unit shown in FIG. 6.

A first description is made of operations of the operation unit 11 and the oscilloscope control unit 50 with reference to the flow chart of FIG. 7.

When an operator sets a vertical range by manipulating a vertical range switch (otherwise, button and the like, not shown) in the operation unit 11, the set vertical range is inputted into the oscilloscope control unit 50 (step 701). The oscilloscope control unit 50 calculates the amplification of the input. circuit 16 corresponding to this set vertical range, and then supplies a control signal S1 indicative of the calculated amplification to the input circuit 16 (step 702).

Next, the operator sets sweep rate (time range) information by the operation unit 11.

As this sweep rate information setting method, in the case that a high sweep range switch (or button) and a low sweep range switch (or button) are provided in the operation unit 11, and are not shown in detail, the operator turns ON one of these switches, for instance, the high sweep range switch (otherwise, low sweep range switch). As a result, such an instruction, namely the sweep rate information is outputted by which the sweep rate range is switched into the high sweep rate range (otherwise, low sweep rate range) by 1 step.

Figure 6:
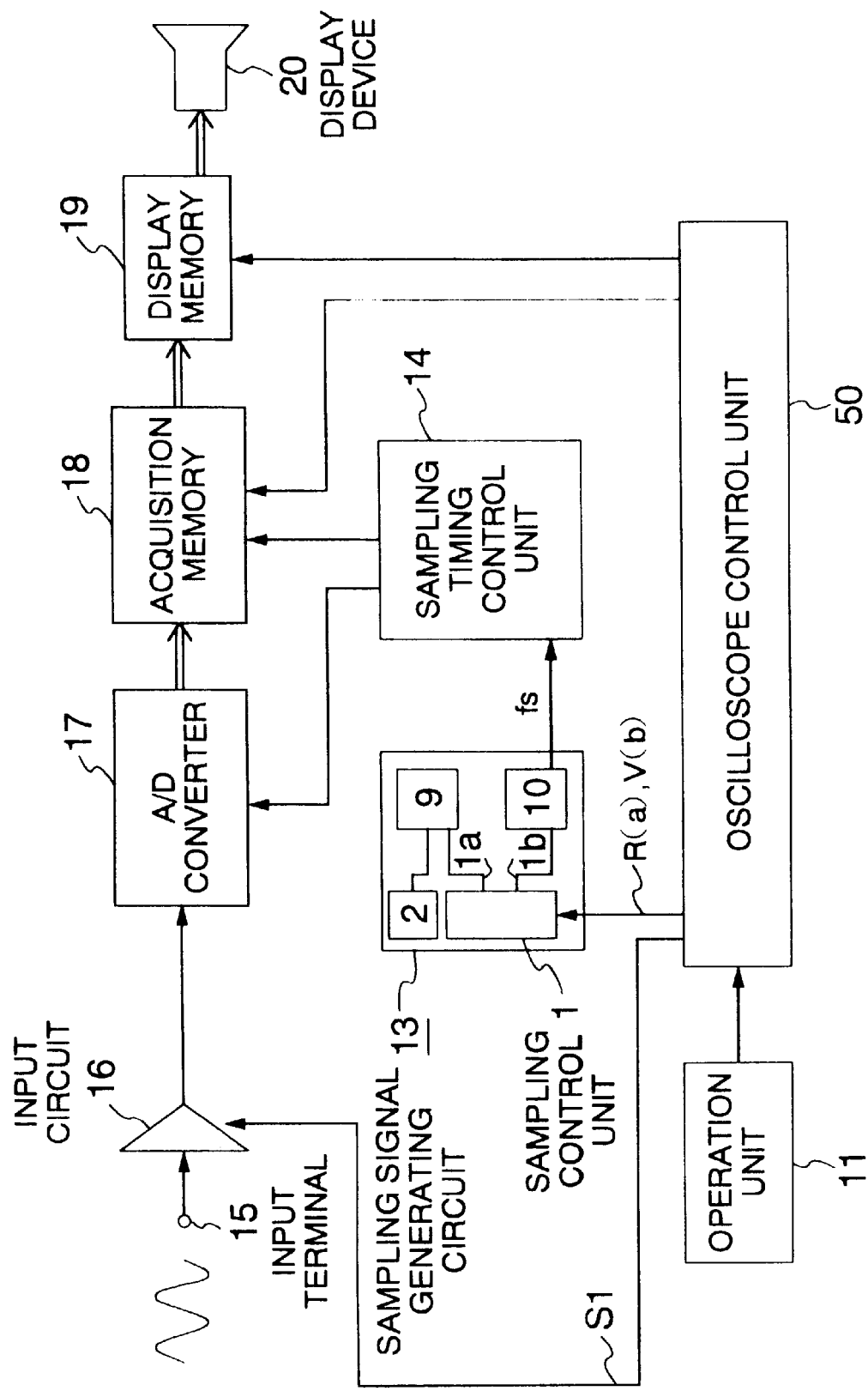
FIG. 6 is a schematic block diagram for indicating an arrangement of a digital oscilloscope to which the sampling signal generating circuit according to the embodiment of the present invention has been applied.

As another setting method, when a high/low sweep rate range selecting switch (or button) and a range updating switch (or button) are provided on the operation unit 11 and are similarly not shown in FIG. 6, the operator may select one of the high sweep rate range and the low sweep rate by manipulating the high/low sweep rate range selecting switch, and may select which step, the sweep rate range (either high sweep rate range, or low sweep rate range) selected by the range updating switch is switched.

In this embodiment, the former setting method will now be explained. As described above, when the instruction (sweep rate information) for switching the sweep rate range (time range) to the high sweep rate range (or low sweep rate range) by 1 step is given from the operation unit 11 to the oscilloscope control unit 50 (step 703), the oscilloscope control unit 50 judges as to whether or not this sweep rate information is instructed to be switched into the high sweep rate range (step 704). If this instruction is not made to be switched into the high sweep rate range, then the process operation is advanced to a step 706, whereas if this instruction is issued to be switched into the high sweep rate range, then the process operation is advanced to a step 705.

At this step 705, the present sweep rate range R(a) is switched to the high sweep rate range by 1 step (namely R(a−1)). Thus, the sweep rate range is selected to become smaller than the present sweep rate range. Thereafter, the process operation is advanced via a step 706 to a further step 708.

On the other hand, when the sweep rate information is to instruct the present sweep rate range to be switched to the low sweep range, the process operation is advanced via the step 706 to a step 707. At the step 707, the present sweep rate range R(a) is switched into the low speed rate by 1 step (namely, R(a+1)). Thus, the sweep rate range becomes larger than the present sweep rate range. Subsequently, the process operation is advanced to a step 708.

At this step 708, the updated sweep rate range R(a) is given to the sample control unit 1.

Subsequently, the operator sets the sweep rate variable information to the operation unit 11.

As this setting method, for example, in the case that a sweep rate range variable value variable resistor (volume) (not shown in detail) is provided in the operation unit 11, when the operator manipulates this variable resistor in order that the sweep rate range variable value is enlarged or compressed to an arbitrary value, such an instruction for changing the sweep rate range into this set variable value, namely sweep rate variable information is outputted.

Also, as another setting method, when both of a sweep rate range variable switch (or button) for the high sweep rate range and another sweep rate range variable switch (or button) for the low speed rate range are provided in the operation unit 11, the operator may depress one of these switches, so that the sweep rate range variable value may be set in response to the depression number of this switch.

When the sweep rate range variable value (time range variable information) set in the above-described manner is supplied from the operation unit 11 to the oscilloscope control unit 50 (step 709), the oscilloscope control unit 50 judges as to whether or not this sweep range variable information instructs to enlarge, or expand the sweep rate range variable value (step 710). If this sweep rate variable information instructs to enlarge the sweep rate range variable value, then the process operation is advanced to a step 711. To the contrary, if this sweep rate variable information does not instruct to enlarge the sweep rate range variable value, then the process operation is advanced to a step 712.

At the step 711, the present variable value V(b) of the sweep rate range is changed into an instructed value V(b+n). In other words, the present variable value of the sweep rate range is increased to a larger variable value. Thereafter, the process operation is advanced via the step 712 to a step 714.

On the other hand, if the sweep rate variable information instructs to compress, or reduce the sweep rate range variable value, then the process operation is advanced via the step 712 to a step 713. At this step 713, the present variable value V(b) of the sweep rate range is changed into an instructed value V(b−n), namely the present variable value of the sweep rate range is decreased to a smaller variable value. Subsequently, the process operation is advanced to a step 714.

At the step 714, the updated variable value V(b) of the sweep rate range is supplied to the sample control unit 1.

Next, at a further step 715, the oscilloscope control unit 50 enters the present sampling setting condition from the operation unit 11. This setting condition implies such a setting condition as to whether or not the sampling operation is updated (namely, new waveform data is sampled), another setting condition as to whether or not the sampling operation is interrupted (i.e., so-called "HOLD" condition) in order to fix the displayed waveform on the screen, and a further setting condition as to whether or not an average process of a waveform is carried out.

At a step 716, a judgement is made as to whether or not the sampling operation is updated from the inputted setting condition. If the sampling operation is updated, then the process operation is advanced to a step 717. That is, in the case that the setting condition represents that either the sampling operation is updated, or the waveform averaging process is carried out, the process operation is advanced to a step 717. In the case that the setting condition indicates that the HOLD condition is carried out, the process operation defined in FIG. 7 is accomplished. At the step 717, a judgement is done as to whether or not the waveform displayed on the screen is updated. If the setting condition indicates that the waveform averaging process is not performed, then it may be judged that the displayed waveform is updated and then the process operation is advanced to a step 718. At this step 718, the display data is transferred from the acquisition memory 18 to the display memory 19. As a result, newly sampled waveform data is displayed.

On the other hand, when the setting condition indicates that the waveform averaging process is carried out at the step 717, no updating operation of the displayed waveform is performed. In other words, no display data is transferred from the acquisition memory 18 to the display memory 19, so that the process operation of FIG. 7 is completed. That is, the displayed content on the screen is normally updated every time the waveform data about 1 screen is sampled. However; in the case of the averaging process, the waveform data about a plurality of display waveforms are previously sampled to calculate an averaged value of these waveform data, and then the averaged waveform data is transferred to the display memory every time the plural sampling operations are carried out. To achieve such an averaging process, the acquisition memory 18 employs such a mechanism that the waveform data acquired during a plurality of sampling operations are added to each other and the added data are divided by a value corresponding to the plural sampling times.

Then, operations of the sampling control unit 1 will now be explained with reference to FIG. 8.

At a first step 801, a calculation is made of a frequency dividing ratio of the frequency $f_0$ to a signal for a sampling signal. This frequency $f_0$ is derived from the original oscillation circuit 2 in correspondence with the updated sweep rate range R(a).

For example, the frequency $f_0$ derived from the original oscillation circuit 2 is selected to be 100 MHz. Also, assuming now that it is 100 data/div., and 10 div. corresponds to a display of 1 screen, the frequency of the sampling signal is equal to 100(data/div.)/1(msec/div.)=100 KHz in the case of 1 msec/div. As a consequence, the frequency dividing ratio of the frequency "$f_0$" to the frequency for the sampling signal become 100 MHz/100 KHz= 1000. Therefore, the frequency dividing ratio become 1000.

Based upon the frequency dividing ratio calculated in the above manner, the corresponding frequency-dividing-ratio switching signal 1b is outputted from the sampling control unit 1 in order to select the relevant frequency divider 8 employed in the variable frequency dividing circuit 10, and an output from this corresponding frequency divider is derived as a signal having a sampling frequency "$f_s$" (step 802).

Subsequently, at a step 802, the frequency dividing ratios "M" and "N" of the frequency dividers 3 and 4 employed in the variable PLL circuit 9 are calculated in accordance with the variable value V(b) of the updated sweep rate range.

For example, when it indicates that the variable value V(b) of the updated sweep rate range is enlarged 1.5 times, a ratio of M/N is equal to 1.5. As the values of N and M, if a value for satisfying it is selected to be, for instance, N=m (symbol "m" being an integer), then M=1.5 is set. In this case, as the values of M and N, positive integers such as values within a range between 1 and 1000 are preferably selected as large as possible in view of high precision.

Thus, the set values M and N are supplied as the frequency setting data 1a to the frequency dividers 3 and 4, and the respective frequency dividing ratios are updated to become the set frequency dividing ratios M and N (step 804).

As described above, since the operator controls the sweep rate range R(a) and also the variable value V(b) of the sweep rate range in the operation unit 11, as represented in FIG. 2C, for example, a waveform in 1 time period can be displayed on the entire display screen.

With reference to FIG. 2A to FIG. 2C, a waveform display in the digital oscilloscope of FIG. 6 will now be explained.

In FIG. 2A, the waveforms are displayed in two time period in the sweep rate range R(a) of 5 ms/div. To observe this waveform in a further enlargement mode, when the present sweep rate range R(a) is updated by 2 ms/div., the waveform in 1 time period could not be observed as represented in FIG. 2B. In this case, according to the present embodiment, the sampling frequency is varied by controlling the variable value V(b) of the sweep rate range, so that the waveform in 1 time period can be displayed just on the entire 1 screen, as represented in FIG. 2C. This operation is available as to any input waveforms having arbitrary time periods. As described above, since the variable value V(b) of the sweep rate range is further set, it is possible to arbitrarily enlarge/compress the waveforms without changing the set value R(a) of the sweep rate range, and also such arbitrary waveforms can be made coincident with the desirable scales. As a consequence, the waveforms can be more easily monitored.

Figure 9A:
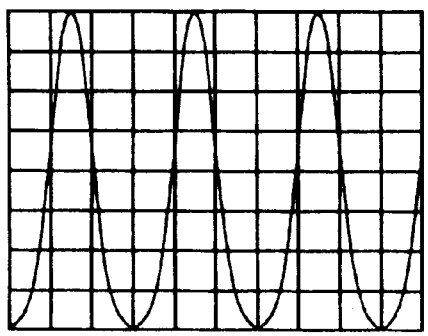
FIGS. 9A, 9B and 9C schematically illustrate display examples of waveform data in the digital oscilloscope of FIG. 6.
Figure 9B:
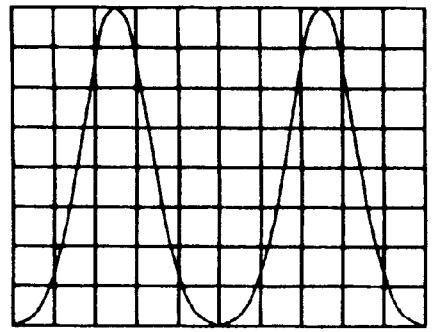

In this case, it is also possible to enlarge/compress the scale on the screen along the horizontal direction in accordance with the enlarging/compressing ratios of the waveform in such a manner that the temporal relationship between the waveform and the scale is established in one-to-one correspondence. In other words, for example, as indicate in FIG. 9A, in the case that waveforms for 3.3 time periods are displayed, when these waveforms are larged so as to display waveforms for 2 time periods (namely, 3.3/2= 1.65 times in enlargement), if the scale dimension illustrated in FIG. 9a, remains then there is no correspondence between the waveforms and the scale (see FIG. 9B). As a result, the time interval between the time periods of the waveforms cannot be correctly read in case of FIG. 9B.

Therefore, in such a case, when the scale would be enlarged/compressed along the horizontal direction with the same ratio as the enlarging/compressing ratio of the waveform in accordance with the sampling sweep rate range R(a) and the variable value V(b) of the sweep rate range, the temporal relationship between the waveform and the scale could be established in one-to-one relationship.

Figure 9C:
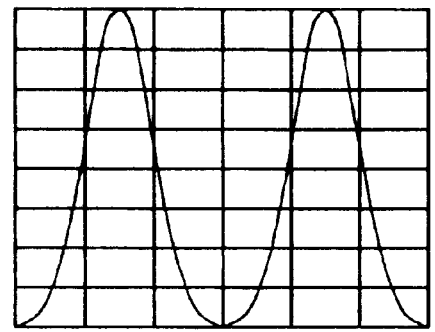

When a scale is fixed on a display screen, for instance, the scale is drawn on the display screen, such a scale cannot be enlarged/compressed along the horizontal direction. However, when a display device is so constructed as to display a scale thereof in an electronic manner, this scale may be enlarged/compressed along the horizontal direction in the above-explained manner. FIG. 9C illustrates such an electronic scale display case. That is, the scale of FIG. 9C is enlarged/compressed along the horizontal direction at the same ratio as the enlarging/compressing ratio of the wave.

As a result, the temporal relationship between the waveform and the scale can be established in one-to-one relationship.

The above-explained control may be achieved by controlling the display memory 19 under control of the oscilloscope control unit 50 in such a way that the scale data to be stored in the display memory 19 together with the waveform data are varied in accordance with the sampling sweep rate range R(a) and the variable value V(b) of the sweep rate range.

Figure 10:
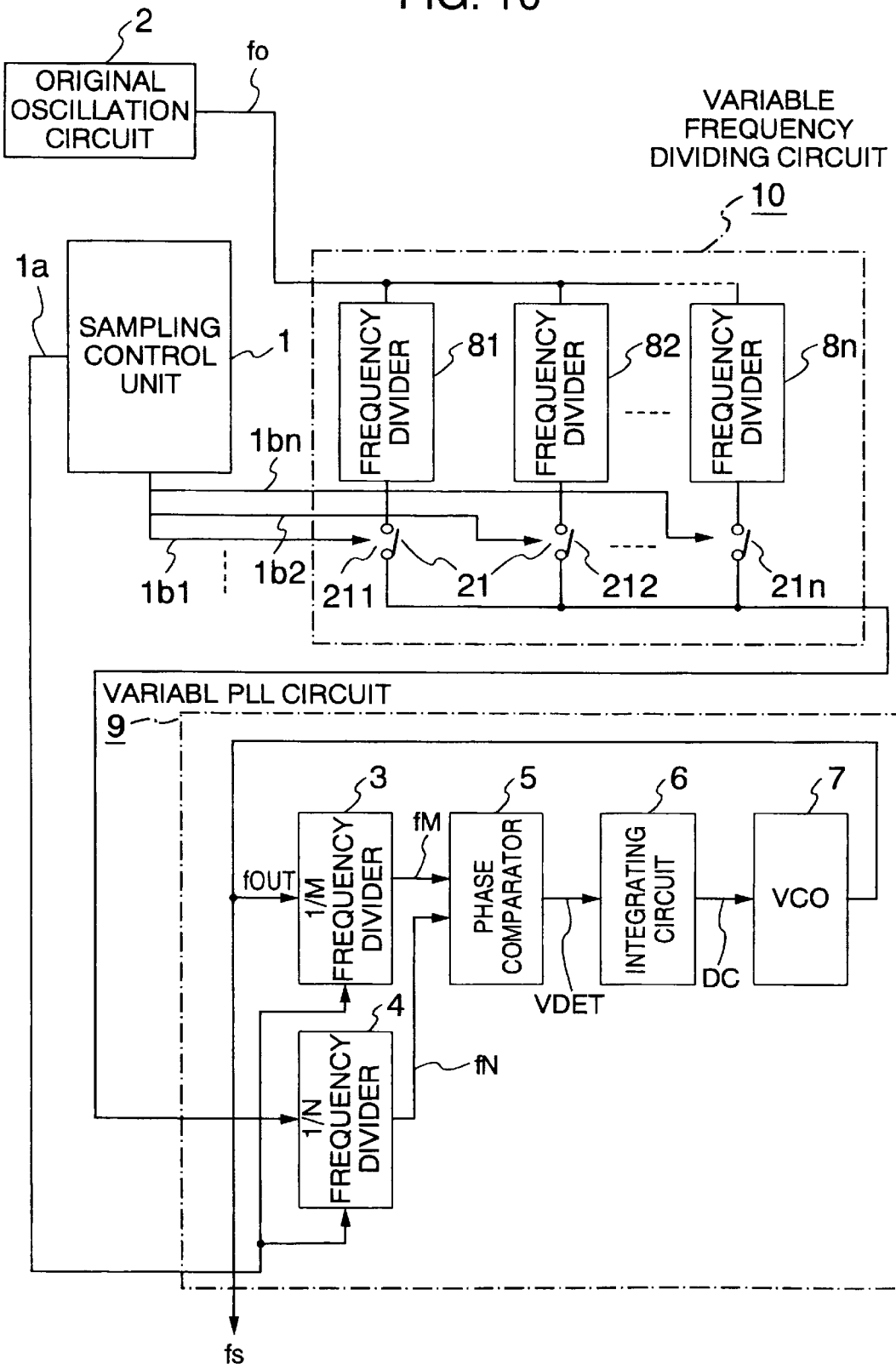
FIG. 10 is a schematic block diagram for showing a circuit arrangement of a sampling signal generating circuit according to another embodiment of the present invention.

In the above-explained embodiments, the output signal from the original oscillation circuit is first inputted into the variable PLL circuit 9, and then the output signal from this variable PLL circuit 9 is entered into the variable frequency dividing circuit 10. However, alternatively, as represented in FIG. 10, the original oscillating frequency may be frequency-divided by the variable frequency dividing circuit 10 at first. Subsequently, this frequency-divided signal may be frequency-divided by the variable PLL circuit 9 connected subsequent to this variable frequency dividing circuit 10 in response to the set variable value. Furthermore, if the variable range of the variable PLL circuit is widened, then this frequency dividing circuit is no longer required. It should be noted that the sweep rate range setting means need not be subdivided into the step type setting means and the variable type setting means, but may be realized by a single setting means.

As previously described, strictly speaking, the variable values of the sweep rate range are not set in the continuous mode. For instance, since a sweep rate range of a digital oscilloscope is restricted by resolution of a display screen (in particular, display pixel numbers along horizontal direction, i.e., time range are 300 dots to 1000 dots), there is no particular effect even when the continuity would be improved higher than this resolution of the display screen. Nevertheless, for example, the variable value may be set with more better continuity by applying a bias voltage to the integrating circuit 6 of FIG. 6. However, in such an alternative example, since there are adverse influences caused by the offset voltage and the noise, the resultant sweep rate precision would be greatly deteriorated, as compared with another case that the frequency dividing ratio is digitally set in the variable mode only by employing the frequency dividers 3 and 4.

While the present invention has been described in detail, the sampling frequency can be arbitrarily varied in the continuous manner. As a consequence, this effect can be further emphasized in the case of such a digital oscilloscope that the sampling-processed waveform is displayed in a display screen. That is, as illustrated in FIG. 2A to FIG. 2C, the sampling frequency is varied by setting the variable value, so that the waveform for 1 time period can be displayed just on one display screen. As explained above, in accordance with the digital oscilloscope of the present invention, the waveform can be arbitrarily enlarged/compressed by setting the variable value without changing the set value of the sweep rate range, so that this waveform can be made coincident with the desirable scale. Accordingly, any operators can readily monitor these waveforms with the very simple operation so as to analyze the waveforms in high precision.

What is claimed is:

1. A digital oscilloscope, comprising:

analog-to-digital converter means for converting an analog signal into a digital signal;

an acquisition memory for storing said digital signal derived from said analog-to-digital converter means;

a display memory for storing the digital signal transferred from said acquisition memory;

a display device for reading out said digital signal stored in said display memory to display as a waveform;

a sampling timing control unit for controlling said digital-to-analog converter means and said acquisition memory to sample said analog signal and said digital signal, respectively;

a sampling signal generating circuit coupled to said sampling timing control unit, for generating sampling signals, comprising:

an original oscillation circuit for oscillating a signal having a predetermined frequency, a variable phase-locked loop circuit coupled to said original oscillation circuit, for continuously varying the frequency of the signal derived from said original oscillation circuit, a sampling control unit, coupled to said variable phase-locked loop circuit, for controlling the sampling rate of said variable phase-locked circuit, and a variable frequency dividing circuit, controlled by said sampling control unit and coupled to said variable phase-locked loop circuit, for changing the frequency of the signal derived from said variable phase-locked loop circuit; and oscilloscope control means for controlling the frequency of said sampling signal generated from said sampling signal generating circuit and for controlling that said digital signal is transferred from said acquisition memory to said display memory.

2. A digital oscilloscope as claimed in claim 1, wherein:

said sampling control unit generates a first and a second control signals, and said variable phase-locked loop circuit is controlled by said first control signal from said sampling control unit; and said oscilloscope control means continuously sets a first sweep rate range and a second sweep rate range in said display device, and controls the frequency of said sampling signal derived from said sampling signal generating circuit; and said sampling signal generating circuit further includes:

a variable frequency dividing circuit coupled to said variable phase-locked loop circuit and controlled by said second control signal from said sampling control unit.

3. A digital oscilloscope as claimed in claim 1, wherein:

said variable phased-locked loop circuit includes:

a first frequency divider for frequency-dividing the frequency of the signal derived from said original oscillation circuit based on a first frequency dividing ratio;

a second frequency divider for frequency-dividing a frequency of a signal derived from a voltage-controlled oscillator based upon a second frequency dividing ratio;

a phase comparator for comparing a phase of an output signal derived from said first frequency divider with a phase of an output signal derived from said second frequency divider, whereby said phase comparator outputs a signal indicative of a phase difference between the output signal of said first frequency divider and the output signal of said second frequency divider;

an integrating circuit for integrating a signal derived from said phase comparator to obtain a DC output; and the voltage-controlled oscillator oscillated at a frequency responding to the output voltage from said integrating circuit, for supplying said oscillated output to said second frequency divider and also to said variable frequency dividing circuit as an output of said phase-locked loop circuit.

4. A digital oscilloscope as claimed in claim 1 wherein:
said variable frequency dividing circuit includes:
a plurality of third frequency dividers connected in parallel to each other, into which the output signal derived from said variable phase-locked loop circuit is inputted, for frequency-dividing the frequency of said output signal based on a plurality of frequency dividing ratios different from each other; and
a selecting circuit for selecting an output of said third frequency divider from said plurality of third frequency dividers based upon control information derived from said sampling control unit, and for outputting said selected output of the third frequency divider as said sampling signal.

5. A digital oscilloscope as claimed in claim 1 wherein:
said oscilloscope control unit includes a means for controlling said display memory in such a manner that scale data on a display screen of said display device for displaying a waveform is set in accordance with first and second sweep rate range set by said oscilloscope control unit.

6. A digital oscilloscopes comprising:
analog-to-digital converter means for converting an analog signal into a digital signal;
an acquisition memory for storing said digital signal derived from said analog-to-digital converter means;
a display memory for storing the digital signal transferred from said acquisition memory;
a display device for reading out said digital signal stored in said display memory to display as a waveform;
a sampling timing control unit for controlling said digital-to-analog converter means and said acquisition memory to sample said analog signal and said digital signal, respectively;
a sampling signal generating circuit coupled to said sampling timing control unit, for generating sampling signals, comprising:
  an original oscillation circuit for oscillating a signal having a predetermined frequency,
  a variable frequency dividing circuit coupled to said original oscillation circuit for changing the frequency of the signal derived from said original oscillation circuit,
  a sampling control unit, coupled to said variable frequency dividing circuit, for controlling an output frequency of said frequency dividing circuit, and
  a variable phase-locked loop circuit controlled by said sampling control unit and coupled to said variable frequency dividing circuit for continuously changing the frequency of the signal derived from said variable frequency dividing circuit; and
  an oscilloscope control unit for controlling the frequency of said sampling signal derived from said sampling signal generating circuit and for controlling that said digital signal is transferred from said acquisition memory to said display memory.

7. A digital oscilloscope as claimed in claim 6 wherein:
said variable phase-locked loop circuit includes:
a first frequency divider for frequency-dividing the frequency of the signal derived from said original oscillation circuit based on a frequency dividing ratio corresponding to said first control signal;
a second frequency divider for frequency-dividing a frequency of a signal derived from a voltage-controlled oscillator based upon a frequency dividing ratio corresponding to said first control signal;
a phase comparator for comparing a phase of an output signal derived from said first frequency divider with a phase of an output signal derived from said second frequency divider to thereby output a signal indicative of a phase difference between the output signal of said first frequency divider and the output signal of said second frequency divider;
an integrating circuit for integrating a signal derived from said phase comparator to obtain a DC output; and
the voltage-controlled oscillator oscillated at a frequency responding to the output voltage from said integrating circuit, for supplying said oscillated output to said second frequency divider and also to said variable frequency dividing circuit as an output of said phase-locked loop circuit.

8. A digital oscilloscope as claimed in claim 6 wherein:
said variable frequency dividing circuit includes:
a plurality of third frequency dividers connected in parallel to each other, into which the output signal derived from said variable phase-locked loop circuit is inputted, for frequency-dividing the frequency of said output signal based on a plurality of frequency dividing ratios different from each other; and
a selecting circuit for selecting an output of said third frequency divider from said plurality of third frequency dividers based upon said second control signal derived from said sampling control unit, and for outputting said selected output of the third frequency divider as said sampling signal.

9. A digital oscilloscope as claimed in claim 6 wherein:
said oscilloscope control unit includes a means for controlling said display memory in such a manner that scale data on a display screen of said display device for displaying a waveform is set in accordance with said first and second sweep rate range information set by said setting unit.

10. A digital oscilloscope for sampling an input signal to store the sampled input signal and further for displaying a waveform of the stored input signal on a display device, comprising:
first setting means for setting first sweep rate range information used to continuously set a sweep rate range to said display device;
second setting means for setting second sweep rate range information used to set said sweep rate range in a step manner to said display device;
an original oscillation circuit for oscillating a signal having a predetermined frequency;
a variable phase-locked loop circuit capable of continuously varying the frequency of the signal derived from said original oscillation circuit, and for changing the signal having a predetermined frequency derived from said original oscillation circuit into such a frequency in response to said first control information, thereby outputting the signal having the changed frequency; and
a variable frequency dividing circuit for frequency-dividing the signal derived from said variable phase-locked loop circuit based on an arbitrary frequency dividing ratio in accordance with said second control information and for outputting the frequency-divided signal as a sampling signal.

11. A digital oscilloscope for sampling an input signal to store the sampled input signal and further for displaying a waveform of the stored input signal on a display device, comprising:

first setting means for setting first sweep rate range information used to continuously set a sweep rate range to said display device;

second setting means for setting second sweep rate range information used to set said sweep rate range in a step manner to said display device;

an original oscillation circuit for oscillating a signal having a predetermined frequency;

a variable frequency dividing circuit for frequency-dividing the signal derived from said original oscillation circuit based on an arbitrary frequency dividing ratio in accordance with said second control information and for outputting the frequency-divided signal; and a variable phase-locked loop circuit capable of continuously varying the frequency of the signal derived from said variable frequency dividing circuit, and for changing the signal having the frequency derived from said variable frequency dividing circuit into such a frequency in response to said first control information, thereby outputting the signal having the changed frequency as a sampling signal.

12. A digital oscilloscope as claimed in claim 6, wherein said variable phase-locked loop circuit coupled to said variable frequency dividing circuit is capable of continuously varying the frequency of the signal derived from said variable frequency dividing circuit.

* * * * *